(12) United States Patent
Sakaguchi

(10) Patent No.: US 10,401,891 B2
(45) Date of Patent: Sep. 3, 2019

(54) REFERENCE VOLTAGE CIRCUIT AND SEMICONDUCTOR DEVICE

(71) Applicant: ABLIC Inc., Chiba-shi, Chiba (JP)

(72) Inventor: Kaoru Sakaguchi, Chiba (JP)

(73) Assignee: Ablic Inc., Chiba-shi, Chiba (JP)

(*) Notice: Subject to any disclaimer, the term of this patent is extended or adjusted under 35 U.S.C. 154(b) by 0 days.

(21) Appl. No.: 16/227,740

(22) Filed: Dec. 20, 2018

(65) Prior Publication Data
US 2019/0243406 A1 Aug. 8, 2019

(30) Foreign Application Priority Data
Feb. 8, 2018 (JP) .................. 2018-020911

(51) Int. Cl.
G05F 3/24 (2006.01)
G05F 3/26 (2006.01)
H01L 27/06 (2006.01)
H01L 27/088 (2006.01)

(52) U.S. Cl.
CPC .......... *G05F 3/262* (2013.01); *H01L 27/0629* (2013.01); *H01L 27/0883* (2013.01)

(58) Field of Classification Search
CPC ..... G05F 3/10; G05F 3/16; G05F 3/20; G05F 3/205; G05F 3/24; G05F 3/247; H01L 27/08883
See application file for complete search history.

(56) References Cited

U.S. PATENT DOCUMENTS

| 4,644,182 | A | * | 2/1987 | Kawashima | ........... | G11C 5/145 |
| | | | | | | 327/263 |
| 6,005,378 | A | * | 12/1999 | D'Angelo | ............... | G05F 3/242 |
| | | | | | | 323/273 |
| 7,948,220 | B2 | * | 5/2011 | Bahramian | ............. | H02M 1/08 |
| | | | | | | 323/224 |
| 2007/0221996 | A1 | | 9/2007 | Imura | | |
| 2011/0018520 | A1 | * | 1/2011 | Imura | ....................... | G05F 3/24 |
| | | | | | | 323/311 |
| 2015/0014740 | A1 | * | 1/2015 | Briere | ..................... | H02H 7/10 |
| | | | | | | 257/133 |

FOREIGN PATENT DOCUMENTS

JP 2007-266715 A 10/2007

* cited by examiner

*Primary Examiner* — Gary L Laxton
(74) *Attorney, Agent, or Firm* — Brinks Gilson & Lione

(57) ABSTRACT

A reference voltage circuit includes: a depletion type MOS transistor and an enhancement type MOS transistor connected in series, and having gates thereof connected in common, the enhancement type MOS transistor providing a reference voltage from a drain thereof, the depletion type MOS transistor including at least a first depletion type MOS transistor and a second depletion type MOS transistor connected in series; and a capacitor having one end connected to a drain of the first depletion type MOS transistor, and the other end connected to a source of the first depletion type MOS transistor.

17 Claims, 5 Drawing Sheets

REFERENCE VOLTAGE CIRCUIT AND SEMICONDUCTOR DEVICE

RELATED APPLICATIONS

This application claims priority under 35 U.S.C. § 119 to Japanese Patent Application No. 2018-020911 filed on Feb. 8, 2018, the entire content of which is hereby incorporated by reference.

BACKGROUND OF THE INVENTION

1. Field of the Invention

The present invention relates to a reference voltage circuit which generates a constant voltage.

2. Description of the Related Art

An ED type reference voltage circuit has heretofore been used as a means for generating a reference voltage in a semiconductor integrated circuit (refer to, for example, Japanese Patent Application Laid-Open No. 2007-266715).

FIG. 5 illustrates a basic ED type reference voltage circuit. The ED type reference voltage circuit 50 in FIG. 5 is constructed from a depletion type MOS transistor 51 and an enhancement type MOS transistor 52 connected in series. Although the circuit is simple, the ED type reference voltage circuit 50 constructed in this way can generate a reference voltage Vref which has small power supply voltage dependency and small temperature dependency.

SUMMARY OF THE INVENTION

In an ED type reference voltage circuit of related art when a current through the depletion type MOS transistor is made small to reduce current consumption thereof, time needed to start a circuit elongates. Particularly, when a capacitive load is connected to the output terminal 3, the increase in time for start becomes remarkable.

The present invention aims to provide a reference voltage circuit which can start quickly even when a capacitive load is connected to the output, while current consumption is low.

A reference voltage circuit according to one aspect of the present invention includes: a depletion type MOS transistor and an enhancement type MOS transistor connected in series, and having gates thereof connected each other, the enhancement type MOS transistor providing a reference voltage from a drain thereof, the depletion type MOS transistor comprising at least a first depletion type MOS transistor and a second depletion type MOS transistor connected in series; and a capacitor having one end connected to a drain of the first depletion type MOS transistor, and the other end connected to a source of the first depletion type MOS transistor.

According to the reference voltage circuit of the present invention, since plural depletion type MOS transistors are connected in series, and a capacitor is provided between a connecting point thereof and the output terminal, quick start can be made even when a capacitive load is connected to the output terminal, while being low in current consumption.

DETAILED DESCRIPTION OF THE PREFERRED EMBODIMENTS

Embodiments of the present invention will hereinafter be described with reference to the accompanying drawings.

First Embodiment

Figure 1:
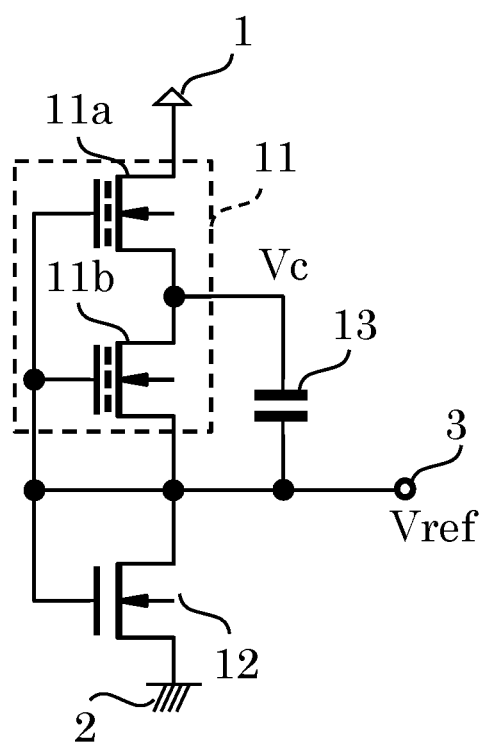
FIG. 1 is a circuit diagram for describing a reference voltage circuit according to a first embodiment of the present invention.

FIG. 1 is a circuit diagram for describing a reference voltage circuit 10 according to a first embodiment of the present invention. The reference voltage circuit 10 provides a constant reference voltage Vref with respect to a reference terminal 2 to an output terminal 3.

The reference voltage circuit 10 includes depletion type NMOS transistors 11a and 11b, an enhancement type NMOS transistor 12, and a capacitor 13.

The depletion type NMOS transistor 11a (the second depletion type NMOS transistor) has a drain connected to a power supply terminal 1, a source connected to a drain of the depletion type NMOS transistor 11b (the first depletion type NMOS transistor), and a gate connected to a gate of the depletion type NMOS transistor 11b. The depletion type NMOS transistor 11b has a gate and a source respectively connected to a gate and a drain of the enhancement type NMOS transistor 12. The enhancement type NMOS transistor 12 has a source connected to the reference terminal 2. The capacitor 13 has one terminal connected to the drain of the depletion type NMOS transistor 11b and the other terminal connected to the source of the depletion type NMOS transistor 11b. The output terminal 3 is connected to a connecting node of the source of the depletion type NMOS transistor 11b and the drain of the enhancement type NMOS transistor 12.

The operation of the reference voltage circuit 10 according to the present embodiment will hereinafter be described.

When a power supply voltage sufficient to operate the reference voltage circuit 10 is applied to the power supply terminal 1, the depletion type NMOS transistor 11a and the enhancement type NMOS transistor 12 operate in a saturated region, and the depletion type NMOS transistor 11b operates in an unsaturated region. Further, since the depletion type NMOS transistors 11a and 11b have gate-to-source voltages larger than their threshold voltages respectively, they both turns on. Thus, since the drain current through the depletion type NMOS transistors 11a and 11b flows in the enhancement type NMOS transistor 12, the enhancement type NMOS transistor 12 generates the reference voltage Vref at its gate.

In a steady state, the capacitor 13 has been charged, and all the current flowing through the source of the depletion type NMOS transistor 11a flows into the drain of the depletion type NMOS transistor 11b. Further, since a load capacity connected to the output terminal 3 has also been charged, all the current flowing through the source of the depletion type NMOS transistor 11b flows into the drain of the enhancement type NMOS transistor 12. Although not illustrated in the drawing, the load capacity is assumed to be the sum of capacitances of a capacitive load connected to the output terminal 3, and gate, junction and wiring also connected to the output terminal 3.

In this state, the depletion type NMOS transistors 11a and 11b function as one depletion type NMOS transistor 11. That is, assuming that the gate widths W of the depletion type NMOS transistors 11a and 11b are equal, and their gate lengths are $L_{11a}$ and $L_{11b}$ respectively, the depletion type NMOS transistor 11 functions as a depletion type NMOS transistor whose gate width is W and gate length is $L_{11a}$+$L_{11b}$. Thus, the current corresponding to the gate width W and the gate length $L_{11a}$+$L_{11b}$ flows through the depletion type NMOS transistor 11.

A description will next be made to the operation in which the reference voltage circuit 10 starts to operate by receiving a power supply voltage from a state in which no power supply voltage is applied to the power supply terminal 1.

In the state in which no power supply voltage is applied to the power supply terminal 1, the capacitor 13 and the load capacity are discharged, and the reference voltage Vref is 0V. When the power supply voltage is applied to the power supply terminal 1, a transient current flows from the depletion type NMOS transistor 11a to the capacitor 13 to start to charge the capacitor 13. Further, the transient current that flows in the capacitor 13 flows to the drain of the enhancement type NMOS transistor 12 and the load capacity so that the load capacity is charged and the reference voltage Vref starts to operate.

That is, during a period up to the completion of charging of the capacitor 13 at the start, the load capacity can be charged by the current flowing from the depletion type NMOS transistor 11a to the capacitor 13. It is thereby possible to reduce current consumption of the reference voltage circuit 10 in the steady state and start the operation of the reference voltage Vref at high speed.

For a higher speed start of the reference voltage Vref in such a configuration, the gate length ($L_{11a}$) of the depletion type NMOS transistor 11a is preferably made shorter than the gate length ($L_{11b}$) of the depletion type NMOS transistor 11b. The potential of the node at which the source of the depletion type NMOS transistor 11a, the drain of the depletion type NMOS transistor 11b, and the one terminal of the capacitor are connected is denoted by Vc, it is thus possible to start the reference voltage Vref at high speed and reduce current consumption in the steady state by increasing the charging current at start so that the voltage Vc attains a higher voltage.

Second Embodiment

Figure 2:
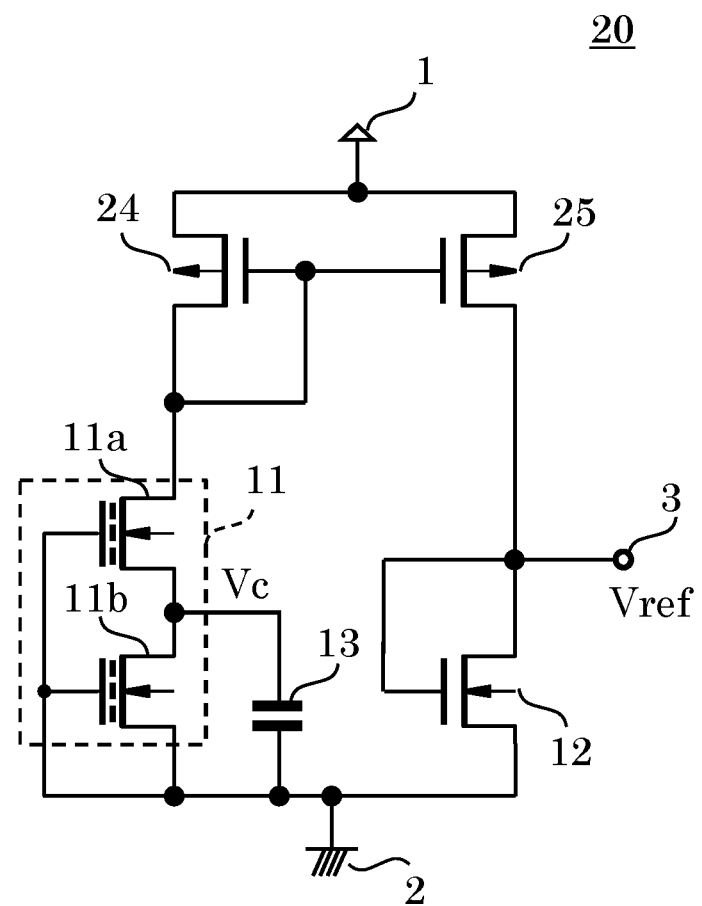
FIG. 2 is a circuit diagram for describing a reference voltage circuit according to a second embodiment of the present invention.

FIG. 2 is a circuit diagram for describing a reference voltage circuit 20 according to a second embodiment. Incidentally, the same components as those in the reference voltage circuit 10 according to the first embodiment illustrated in FIG. 1 are denoted by the same reference numerals, and their dual description will be omitted as appropriate.

In the reference voltage circuit 20 depletion type NMOS transistors 11a and 11b, an enhancement type NMOS transistor 12, and a capacitor 13 are arranged as illustrated in the drawing and a current mirror circuit constructed from a PMOS transistor 24 and a PMOS transistor 25 are added as compared to the reference voltage circuit 10 according to the first embodiment.

The operation of the reference voltage circuit 20 constructed as above will be described below.

In a steady state, the capacitor 13 and the load capacity are charged, and a current flowing through the depletion type NMOS transistor 11a is mirrored by the current mirror circuit to the current flowing through the enhancement type NMOS transistor 12 to thereby generate a reference voltage Vref. The above operation is similar to that in the reference voltage circuit 10.

A description will next be made to the operation in which the reference voltage circuit 20 starts to operate by receiving a power supply voltage from a state in which no power supply voltage is applied to a power supply terminal 1.

In the state in which no power supply voltage is applied to the power supply terminal 1, the capacitor 13 and the load capacity are discharged, and the reference voltage Vref is 0V. When the power supply voltage is applied to the power supply terminal 1, charging of the capacitor 13 starts. While the capacitor 13 is transiently charged, the depletion type NMOS transistor 11a becomes dominant since the gate length of the depletion type NMOS transistor 11 is short and a current flowing therethrough is larger than that in the steady state. The mirrored current flows through the drain of the enhancement type NMOS transistor 12 to the load capacity. The load capacity is thereby charged so that the reference voltage Vref starts to operate. With the above operation, the reference voltage circuit 20 can obtain an effect similar to that in the reference voltage circuit 10.

As described above, the reference voltage circuit 20 with the current mirror circuit has an effect that the NMOS transistor is hardly affected by the back-gate effect even in the case of a low-cost CMOS process using a P-type substrate.

Third Embodiment

Figure 3:
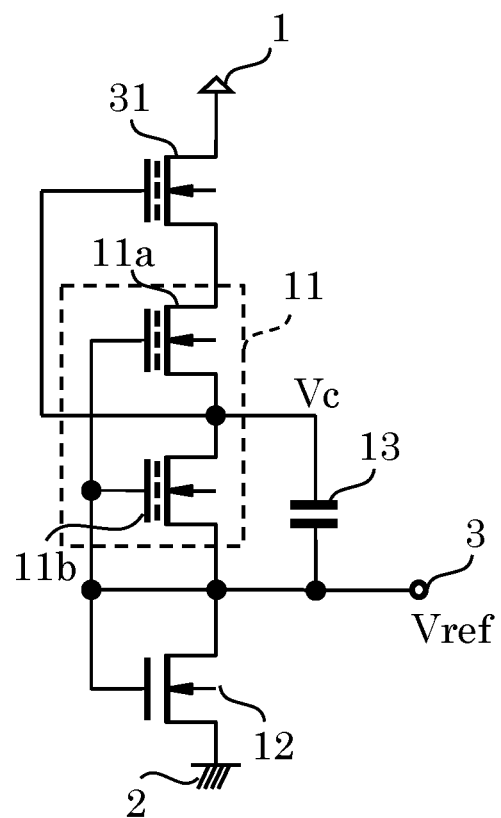
FIG. 3 is a circuit diagram for describing a reference voltage circuit according to a third embodiment of the present invention.

FIG. 3 is a circuit diagram for describing a reference voltage circuit 30 according to a third embodiment of the present invention. Incidentally, the same components as those in the reference voltage circuit 10 according to the first embodiment illustrated in FIG. 1 are denoted by the same reference numerals, and their dual description will be omitted as appropriate.

In the reference voltage circuit 30 according to the third embodiment a depletion type NMOS transistor 31 cascode-connected between a depletion type NMOS transistor 11a and a power supply terminal 1 is added compared to the reference voltage circuit 10 according to the first embodiment. Specifically, the depletion type NMOS transistor 31 has a gate connected to a source of the depletion type NMOS transistor 11a, a drain connected to the power supply terminal 1, and a source connected to a drain of the depletion type NMOS transistor 11a. In other part of the circuit, the reference voltage circuit 30 has the same configuration as the reference voltage circuit 10.

The steady state operation and the starting operation of the reference voltage circuit 30 are similar to those of the reference voltage circuit 10 and also have similar effect. According to the reference voltage circuit 30 of the present embodiment, in addition to the effect described in the first embodiment, an effect that a reference voltage Vref is more stable with respect to a variation in power supply voltage of the power supply terminal 1 is obtained.

Figure 4:
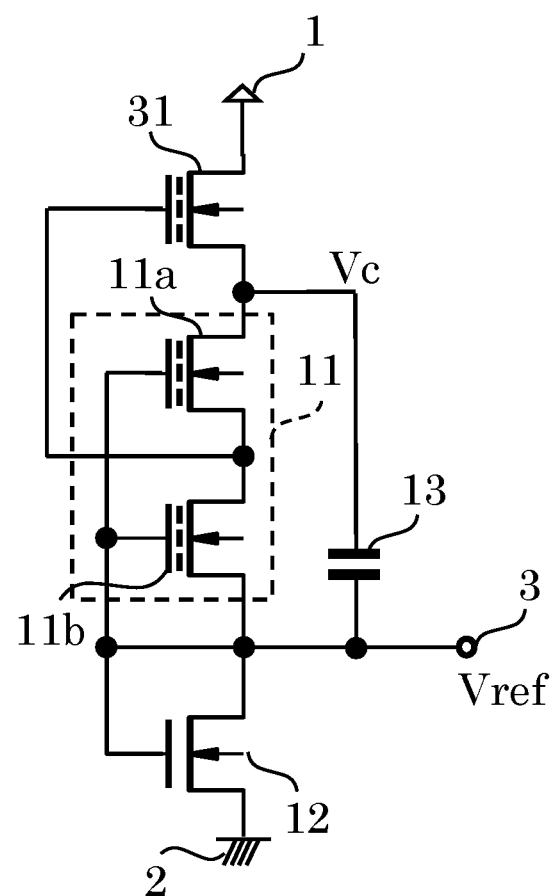
FIG. 4 is a circuit diagram for describing another example of the reference voltage circuit according to the third embodiment.
Figure 5:
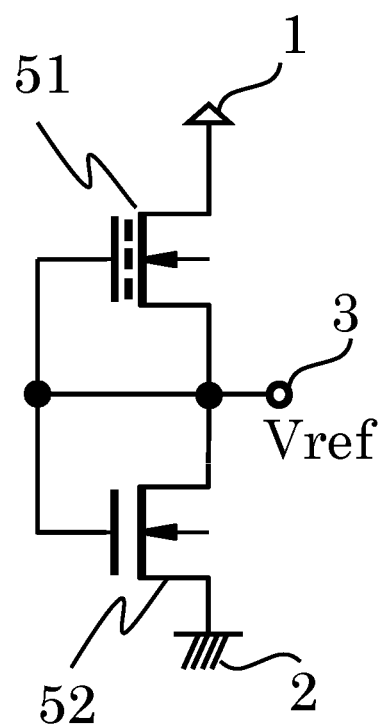
FIG. 5 is a circuit diagram for describing a related art reference voltage circuit.

FIG. 4 is a circuit diagram for describing another example of the third embodiment. The reference voltage circuit 40 differs from the reference voltage circuit 30 in that the connecting position of a capacitor 13 is changed. Specifically, one terminal of the capacitor 13 is connected to an output terminal 3, and the other terminal thereof is connected to the source of the depletion type NMOS transistor 31. In other part the reference voltage circuit 40 has the same configuration as the reference voltage circuit 30.

The steady state operation of the reference voltage circuit 40 is similar to that of the reference voltage circuit 10. Since the reference voltage circuit 40 is constructed to charge the capacitor 13 through only the depletion type NMOS transistor 31 in the starting operation, the reference voltage Vref starts operation at a speed higher than in the reference voltage circuit 30.

That is, according to the reference voltage circuit 40, in addition to the effect of the reference voltage circuit 30, there is an effect that the reference voltage Vref can start operation at higher speed.

As described above, since the plural depletion type MOS transistors are connected in series, and the capacitor is provided between the connecting point thereof and the output terminal, the reference voltage circuit of the present invention can start quickly even when the capacitive load is connected to the output terminal, while being low in current consumption.

Although the embodiments of the present invention have been described above, the present invention is not limited to the above embodiments. It is needless to say that various changes can be made thereto within the scope not departing from the spirit of the present invention.

For example, in a semiconductor integrated circuit for an application high in power supply voltage, the depletion type NMOS transistor 11a may be replaced by a high breakdown voltage depletion type NMOS transistor.

Also, although the gate widths of the depletion type NMOS transistor 11a and the depletion type NMOS transistor 11b have been described to be equal, for example, the gate widths may be adjusted as appropriate so as to bring about the effect of the present invention.

Further, for example, the second embodiment can also be based on a circuit configuration in which the transistor cascode-connected as in the depletion type NMOS transistor 31 in the third embodiment is added between the depletion type NMOS transistor 11a and the PMOS transistor 24.

Furthermore, for example, there can also be provided a circuit configuration in which a depletion type PMOS transistor is used as the depletion type NMOS transistor, and an enhancement type PMOS transistor is used in place of the enhancement type NMOS transistor.

What is claimed is:

1. A reference voltage circuit comprising:
    a depletion type MOS transistor and an enhancement type MOS transistor connected in series, and having gates thereof connected in common, the enhancement type MOS transistor providing a reference voltage from a drain thereof, the depletion type MOS transistor comprising at least a first depletion type MOS transistor and a second depletion type MOS transistor connected in series; and
    a capacitor having one end connected to a drain of the first depletion type MOS transistor, and the other end connected to a source of the first depletion type MOS transistor.

2. The reference voltage circuit according to claim 1, wherein the second depletion type MOS transistor has a higher current supply capability than the first depletion type MOS transistor.

3. The reference voltage circuit according to claim 1, further comprising a current mirror circuit which mirrors a current flowing through the depletion type MOS transistor to a current flowing to the drain of the enhancement type MOS transistor.

4. The reference voltage circuit according to claim 1, wherein the second depletion type MOS transistor has a higher breakdown voltage between the gate and the drain and a higher breakdown voltage between the source and the drain than the first depletion type MOS transistor.

5. The reference voltage circuit according to claim 1, further comprising a third depletion type MOS transistor having a gate connected to the source of the second depletion type MOS transistor and cascode-connected to the second depletion type MOS transistor.

6. The reference voltage circuit according to claim 2, further comprising a current mirror circuit which mirrors a current flowing through the depletion type MOS transistor to a current flowing to the drain of the enhancement type MOS transistor.

7. The reference voltage circuit according to claim 2, wherein the second depletion type MOS transistor has a higher breakdown voltage between the gate and the drain and a higher breakdown voltage between the source and the drain than the first depletion type MOS transistor.

8. The reference voltage circuit according to claim 2, further comprising a third depletion type MOS transistor having a gate connected to the source of the second depletion type MOS transistor and cascode-connected to the second depletion type MOS transistor.

9. The reference voltage circuit according to claim 5, wherein the third depletion type MOS transistor has a higher breakdown voltage between the gate and the drain and a higher breakdown voltage between the source and the drain than the second depletion type MOS transistor.

10. A reference voltage circuit comprising:
    a depletion type MOS transistor and an enhancement type MOS transistor connected in series and having gates thereof connected in common, the enhancement type MOS transistor providing a reference voltage from a drain thereof, the depletion type MOS transistor comprising at least a first depletion type MOS transistor and a second depletion type MOS transistors connected in series;
    a third depletion type MOS transistor having a gate connected to a source of the second depletion type MOS transistor and cascode-connected to the second depletion type MOS transistor; and
    a capacitor having one end connected to a source of the third depletion type MOS transistor, and the other end connected to a source of the first depletion type MOS transistor.

11. The reference voltage circuit according to claim 10, wherein the third depletion type MOS transistor has a higher current supply capability than the first and second depletion type MOS transistors.

12. The reference voltage circuit according to claim 10, further comprising a current mirror circuit which mirrors a current flowing through the depletion type MOS transistor to a current flowing to the drain of the enhancement type MOS transistor.

13. The reference voltage circuit according to claim 10, wherein the third depletion type MOS transistor has a higher breakdown voltage between the gate and the drain and a higher breakdown voltage between the source and the drain than the second depletion type MOS transistor.

14. The reference voltage circuit according to claim 11, further comprising a current mirror circuit which mirrors a current flowing through the depletion type MOS transistor to a current flowing to the drain of the enhancement type MOS transistor.

15. The reference voltage circuit according to claim 11, wherein the third depletion type MOS transistor has a higher breakdown voltage between the gate and the drain and a higher breakdown voltage between the source and the drain than the second depletion type MOS transistor.

16. A semiconductor device comprising the reference voltage circuit according to claim 1.

17. A semiconductor device comprising the reference voltage circuit according to claim 10.

* * * * *